US010280493B2

(12) United States Patent
Kang

(10) Patent No.: US 10,280,493 B2
(45) Date of Patent: May 7, 2019

(54) FOLDABLE DISPLAY STRUCTURES

(75) Inventor: James W. Kang, Laguna Hills, CA (US)

(73) Assignee: CORNERSTONE INTELLECTUAL PROPERTY, LLC, South Lake Forest, CA (US)

(*) Notice: Subject to any disclaimer, the term of this patent is extended or adjusted under 35 U.S.C. 154(b) by 0 days.

(21) Appl. No.: 13/571,877

(22) Filed: Aug. 10, 2012

(65) Prior Publication Data

US 2013/0037832 A1    Feb. 14, 2013

Related U.S. Application Data

(60) Provisional application No. 61/522,949, filed on Aug. 12, 2011.

(51) Int. Cl.
| | | |
|---|---|---|
| *C22C 45/00* | (2006.01) | |
| *H01L 51/00* | (2006.01) | |
| *H05K 1/18* | (2006.01) | |
| *C22F 1/00* | (2006.01) | |
| *C22F 1/18* | (2006.01) | |
| *C22C 1/00* | (2006.01) | |
| *C22C 33/00* | (2006.01) | |
| *C22C 45/02* | (2006.01) | |

(Continued)

(52) U.S. Cl.
CPC ............ *C22C 45/00* (2013.01); *C22C 1/002* (2013.01); *C22C 33/003* (2013.01); *C22C 45/02* (2013.01); *C22C 45/10* (2013.01); *C22F 1/00* (2013.01); *C22F 1/18* (2013.01); *C22F 1/183* (2013.01); *C22F 1/186* (2013.01); *H01L 51/0097* (2013.01); *H05K 1/189* (2013.01); *H01L 51/5237* (2013.01); *H01L 2251/5338* (2013.01); *H05K 2201/05* (2013.01)

(58) Field of Classification Search
CPC ......... C22C 45/00; C22C 45/10; C22C 1/002; C22C 33/003; C22C 45/02; C22F 1/00; C22F 1/18; C22F 1/186; C22F 1/183; H01L 51/5237; H01L 2251/5338; H01L 51/50; H01L 2251/566; H01L 51/0097; H05K 1/189; H05K 2201/05
See application file for complete search history.

(56) References Cited

U.S. PATENT DOCUMENTS 2,601,374 A    6/1952    Ditzler et al.
4,116,682 A    9/1978    Polk et al.
(Continued)

FOREIGN PATENT DOCUMENTS

JP    2001303218 A    10/2001
WO    2013009208 A1    7/2011

OTHER PUBLICATIONS

Kwon, et al. "Mechanically and optically reliable folding structure with a hyperelastic material for seamless foldable displays." Applied Physics Letters 98, 151904, 2011).*

(Continued)

*Primary Examiner* — Yasser A Abdelaziez
(74) *Attorney, Agent, or Firm* — Raju Dave; Davé Law Group, LLC

(57) ABSTRACT

One embodiment provides a structure, comprising: a display; at least one structural component disposed over a portion of the display, wherein the at least on structural component comprises at least one amorphous alloy; and wherein a portion of the display is foldable.

18 Claims, 3 Drawing Sheets

(51) Int. Cl.
*C22C 45/10* (2006.01)
*H01L 51/52* (2006.01)

(56) References Cited

U.S. PATENT DOCUMENTS

| | | |
|---|---|---|
| 5,288,344 A | 2/1994 | Peker |
| 5,368,659 A | 11/1994 | Peker |
| 5,618,359 A | 4/1997 | Lin |
| 5,735,975 A | 4/1998 | Lin |
| 5,818,165 A | 10/1998 | Malhi |
| 6,325,868 B1 | 12/2001 | Kim |
| 6,771,490 B2 | 8/2004 | Peker et al. |
| 7,777,856 B2 | 8/2010 | Silverbrook |
| 8,159,130 B2 | 4/2012 | Shim et al. |
| 8,738,104 B2 | 5/2014 | Yeates |
| 2006/0122687 A1 | 6/2006 | Bassler et al. |
| 2007/0079869 A1* | 4/2007 | Yukinobu ............ H01G 9/2022 136/263 |
| 2007/0132387 A1 | 6/2007 | Moore |
| 2007/0211036 A1 | 9/2007 | Perkins |
| 2010/0178452 A1 | 7/2010 | Yoon et al. |
| 2010/0283713 A1 | 11/2010 | Fein et al. |
| 2011/0018424 A1* | 1/2011 | Takada ............ H01L 31/022466 313/352 |
| 2011/0084898 A1 | 4/2011 | Ebbeling et al. |

OTHER PUBLICATIONS

The Search Report received in the related International Patent Application No. PCT/US12/50310, dated Jan. 23, 2013.

Hays, et al., "Microstructure Controlled Shear Band Pattern Formation and Enhanced Plasticity of Bulk Metallic Glasses Containing in situ Formed Ductile Phase Dendrite Dispersions", Physical Review Letters, vol. 84, 2000, p. 2901-2904.

Inoue, et al., "Bulk amorphous alloys with high mechanical strength and good soft magnetic properties in Fe—TM—B (TM51V-VIII group transition metal) system", Appl. Phys. Lett., vol. 7, 1997, p. 464-466.

Shen, et al., "Bulk Glassy C043Fe20Tas.sB31.S Alloy with High Glass-Fornting Ability and Good Soft Magnetic Properties", Mater. Trans. Jim, vol. 42, 2001, p. 2136-2139.

Thirugnanam, M., "Modern High Pressure Die-Casting Processes for Aluminium Castings", Transaction of Indian Foundry Congress, vol. 61, pp. 1-7, 2013.

Zyga, Lisa, Foldable Display Shows No Crease After 100,000 Folding Cycles, May 2011, http://phys.org/news/2011-05-foldable-crease.html; 2 pages.

Ma, Rui-Qing, et al., Flexible Active-Matrix Oled Displays: Challenges and Progress, Jan. 2008, http://onlinelibrary.wiley.com/doi/10.1889/1.2835025/abstract; 1 page.

* cited by examiner

FOLDABLE DISPLAY STRUCTURES

RELATED APPLICATION

This application claims priority from U.S. Provisional Application Ser. No. 61/522,949, filed Aug. 12, 2012, which is hereby incorporated by reference in its entirety.

BACKGROUND

Foldable displays are recently developed displays that may be very thin and made of solid-state semiconductor devices. In pre-existing Organic Light Emitting Diode ("OLED") displays, the semiconductor device section is generally 100 to 500 nanometers thick and comprises at least one layer of an organic material. The semiconductor device portion of the pre-existing displays is generally supported by a substrate which is made of clear plastic, glass, or very thin metallic foil. The primary function of the substrate is for manufacturing purposes (for deposition and application of the organic layers); otherwise, the substrate does not provide any structural benefit.

One advantage of OLEDs is their ability to be rolled or folded into compact shapes which may be an advantage for portable electronic devices, whether hand-held smartphones or large area wall-mountable displays. However, the OLEDs do not have structural stability and rigidity to maintain a flat shape, especially after multiple folding and/or rolling. This inability to remain flat may adversely affect their optimal function with the increasing demand for high definition display. The common materials used for the substrate of pre-existing display structures, such as plastics, aluminum, and glass, may not provide enough strength, rigidity, and durability without increasing the bulkiness of the display structures, which in turn adversely impacts the flexibility of OLED display.

SUMMARY

In view of the foregoing, the Inventor has recognized and appreciated the advantages of providing improved structural support to OLEDs to provide and enhance their flatness and durability while preserving their flexibility and ability to be folded or rolled into compact shapes for multiple uses.

Accordingly, provided in one embodiment is a structure, comprising: a display; at least one structural component disposed over a portion of the display, wherein the at least one structural component comprises at least one amorphous alloy; and wherein a portion of the display is foldable.

Another embodiment provides a method of making a foldable display structure, the method comprising: assembling a display with at least one structural component, wherein the at least one structural component is made by a method comprising: heating a feedstock comprising an alloy that is at least substantially amorphous to a first temperature that is greater than or equal to a glass transition temperature (Tg) of the alloy; forming the heated feedstock into a preform; and cooling the preform to a second temperature lower than the Tg to form the at least one structural component.

Another embodiment provides a foldable display, comprising: a display comprising at least one organic light emitting diode; and a plurality of structural components disposed over a portion of the display; wherein the plurality of the structural components comprises at least one bulk solidifying amorphous alloy; and wherein the display remains at least substantially flat after multiple folding.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Figure 1:
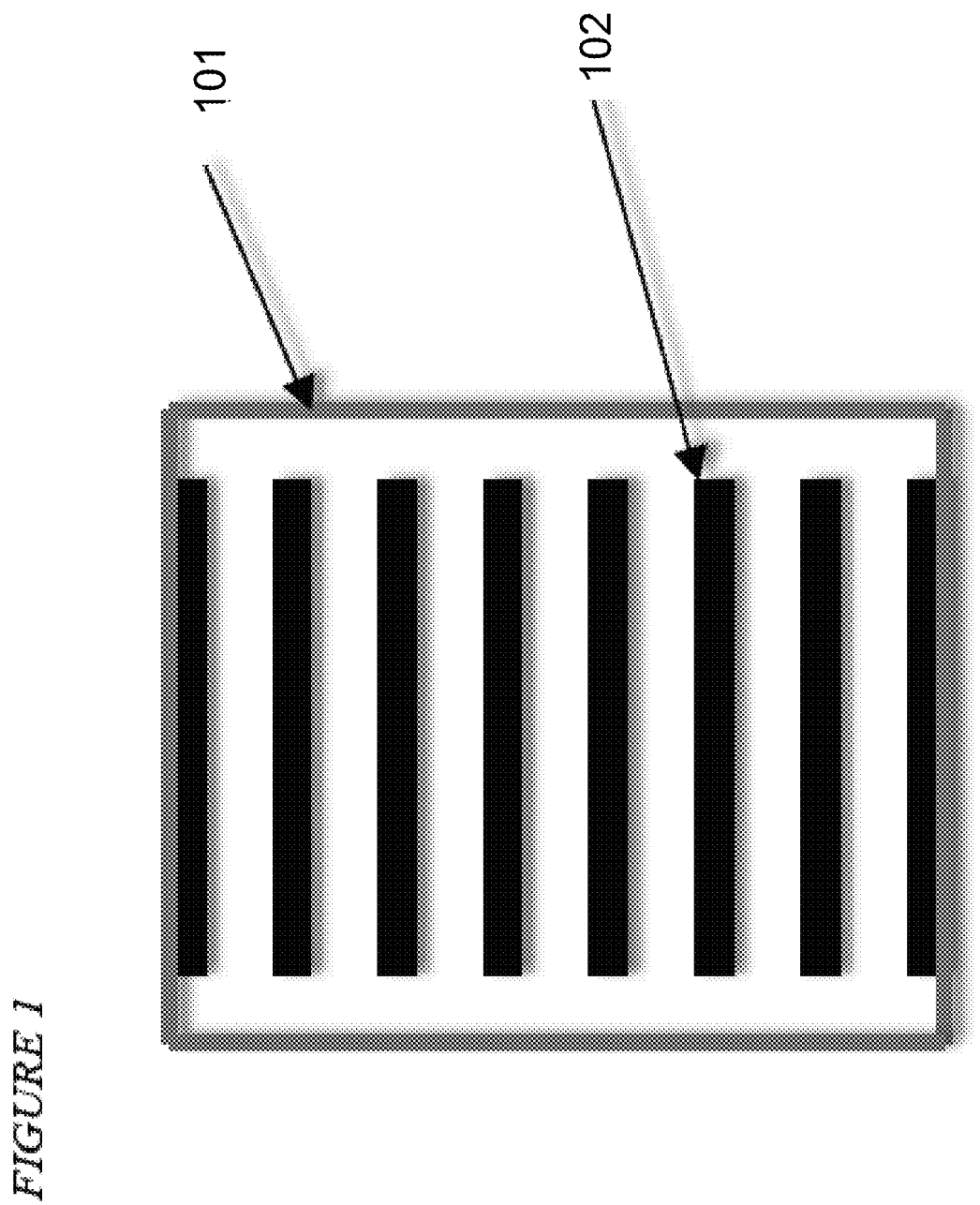
FIG. 1 provides a schematic of a foldable display structure according to one exemplary embodiment.

Following are more detailed descriptions of various concepts related to, and embodiments of, inventive metal-containing coating and methods of making and using the coating. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Amorphous Alloys

An alloy may refer to a solid solution of two or more metal elements (e.g., at least 2, 3, 4, 5, or more elements) or an intermetallic compound (including at least one metal element and at least one non-metal element). The term "element" herein may refer to an element that may be found in the Periodic Table. A metal may refer to any of alkali metals, alkaline earth metals, transition metals, post-transition metals, lanthanides, actinides, and metalloids.

An amorphous alloy may refer to an alloy having an amorphous, non-crystalline atomic or microstructure. The amorphous structure may refer to a glassy structure with no observable long range order; in some instances, an amorphous structure may exhibit some short range order. Thus, an amorphous alloy may sometimes be referred to as a "metallic glass." An amorphous alloy may refer to an alloy that is at least partially amorphous, including at least substantially amorphous, such as entirely amorphous, depending on the context. In one embodiment, an amorphous alloy may be an alloy of which at least about 50% is an amorphous phase—e.g., at least about 60%, about 70%, about 80%, about 90%, about 95%, about 99% or more. The percentage herein may refer to volume percent or weight percent, depending on the context. The term "phase" herein may refer to a physically distinctive form of a substance, such as microstructure. For example, a solid and a liquid are different phases. Similarly, an amorphous phase is different from a crystalline phase.

Amorphous alloys may contain a variety of metal elements and/or non-metal elements. In some embodiments, the amorphous alloys may comprise zirconium, titanium, iron, copper, nickel, gold, platinum, palladium, aluminum, or combinations thereof. In some embodiments, the amorphous alloys may be zirconium-based, titanium-based, iron-based, copper-based, nickel-based, gold-based, platinum-based, palladium-based, or aluminum-based. The term "M-based" when referred to an alloy may refer to an alloy comprising at least about 30% of the M element—e.g., about 40%, about 50%, about 60%, about 70%, about 80%, about 90%, about 95%, or more. The percentage herein may refer to volume percent or weight percent, depending on the context.

An amorphous alloy may be a bulk solidifying amorphous alloy. A bulk solidifying amorphous alloy, or bulk amorphous alloy, or bulk metallic glass ("BMG"), may refer to an amorphous alloy that has at least one dimension in the millimeter range, which is substantially thicker than conventional amorphous alloys, which generally have a thickness of 0.02 mm. In one embodiment, this dimension may refer to the smallest dimension. Depending on the geometry, the dimension may refer to thickness, height, length, width, radius, and the like. In some embodiments, this smallest dimension may be at least about 0.5 mm—e.g., about 1 mm, about 2 mm, about 3 mm, about 4 mm, about 5 mm, about 6 mm, about 8 mm, about 10 mm, about 12 mm, or more. The magnitude of the largest dimension is not limited and may be in the millimeter range, centimeter range, or even meter range.

An amorphous alloy, including a bulk amorphous alloy, described herein may have a critical cooling rate of about 500 K/sec or less, in contrast to that of $10^5$ K/sec or more for conventional amorphous alloys. The term "critical cooling rate" herein may refer to the cooling rate below which an amorphous structure is not energetically favorable and thus is not likely to form during a fabrication process. In some embodiments, the critical cooling rate of the amorphous alloy described herein may be, for example, about 400 K/sec or less—e.g., about 300 K/sec or less, about 250 K/sec or less, about 200 K/sec or less. Some examples of bulk solidifying amorphous alloys may be found in U.S. Pat. Nos. 5,288,344; 5,368,659; 5,618,359; and 5,735,975. In some embodiments wherein the desired diameter (or width, thickness, etc., depending on the geometry) is small, a higher cooler rate, such as one used in the conventional amorphous alloy fabrication process, may be used.

The amorphous alloy may have a variety of chemical compositions. In one embodiment, the amorphous alloy is a Zr-based alloy, such as a Zr—Ti based alloy, such as (Zr, Ti)$_a$(Ni, Cu, Fe)$_b$(Be, Al, Si, B)$_c$, where each of a, b, c, is independently a number representing atomic % and a is in the range of from 30 to 75, b is in the range of from 5 to 60, and c is in the range of from 0 to 50. Other incidental, inevitable minute amounts of impurities may also be present. In some embodiments, these alloys may accommodate substantial amounts of other transition metals, such as Nb, Cr, V, Co. A "substantial amount" in one embodiment may refer to about 5 atomic % or more—e.g., 10 atomic %, 20 atomic %, 30 atomic %, or more.

In one embodiment, an amorphous alloy herein may have the chemical formula (Zr, Ti)$_b$(Ni, Cu)$_b$(Be)$_c$, where each of a, b, c, is independently a number representing atomic % and a is in the range of from 40 to 75, b is in the range of from 5 to 50, and c is in the range of from 5 to 50. Other incidental, inevitable minute amounts of impurities may also be present. In another embodiment, the alloy may have a composition (Zr, Ti)$_b$(Ni, Cu)$_b$(Be)$_c$, where each of a, b, c, is independently a number representing atomic % and a is in the range of from 45 to 65, b is in the range of from 7.5 to 35, and c is in the range of from 10 to 37.5 in atomic percentages.

In another embodiment, the amorphous alloy described herein may have the chemical formula (Zr)$_a$(Nb, Ti)$_b$(Ni, Cu)$_c$(Al)$_d$, where each of a, b, c, d is independently a number representing atomic % and a is in the range of from 45 to 65, b is in the range of from 0 to 10, c is in the range of from 20 to 40, and d is in the range of from 7.5 to 15. Other incidental, inevitable minute amounts of impurities may also be present.

In some embodiments, the amorphous alloy may be a ferrous-metal based alloy, such as a (Fe, Ni, Co) based compositions. Examples of such compositions are disclosed in U.S. Pat. No. 6,325,868 and in publications (A. Inoue et. al., Appl. Phys. Lett., Volume 71, p 464 (1997)), (Shen et. al., Mater. Trans., JIM, Volume 42, p 2136 (2001)), and Japanese patent application 2000126277 (Pub. #2001303218 A). For example, the alloy may be $Fe_{72}Al_5Ga_2P_{11}C_6B_4$, or $Fe_{72}Al_7Zr_{10}Mo_5W_2B_{15}$.

Amorphous alloys, including bulk solidifying amorphous alloys, may have high strength and high hardness. The strength may refer to tensile or compressive strength, depending on the context. For example, Zr and Ti-based amorphous alloys may have tensile yield strengths of about 250 ksi or higher, hardness values of about 450 Vickers or higher, or both. In some embodiments, the tensile yield strength may be about 300 ksi or higher—e.g., at least about 400 ksi, about 500 ksi, about 600 ksi, about 800 ksi, or higher. In some embodiments, the hardness value may be at least about 500 Vickers—e.g., at least about 550, about 600, about 700, about 800, about 900 Vickers, or higher.

In one embodiment, ferrous metal based amorphous alloys, including the ferrous metal based bulk solidifying amorphous alloys, can have tensile yield strengths of about 500 ksi or higher and hardness values of about 1000 Vickers or higher. In some embodiments, the tensile yield strength may be about 550 ksi or higher—e.g., at least about 600 ksi, about 700 ksi, about 800 ksi, about 900 ksi, or higher. In some embodiments, the hardness value may be at least about 1000 Vickers—e.g., at least about 1100 Vickers, about 1200 Vickers, about 1400 Vickers, about 1500 Vickers, about 1600 Vickers, or higher.

As such, any of the aforedescribed amorphous alloys may have a desirable strength-to-weight ratio. Furthermore, amorphous alloys, particularly the Zr— or Ti-based alloys, may exhibit good corrosion resistance and environmental durability. The corrosion herein may refer to chemical corrosion, stress corrosion, or a combination thereof.

The amorphous alloys, including bulk amorphous alloys, described herein may have a high elastic strain limit of at least about 0.5%, including at least about 1%, about 1.2%, about 1.5%, about 1.6%, about 1.8%, about 2%, or more—this value is much higher than any other metal alloy known to date.

In some embodiments, the amorphous alloys, including bulk amorphous alloys, may additionally include some crystalline materials, such as crystalline alloys. The crystalline material may have the same or different chemistry from the amorphous alloy. For example, in the case wherein the crystalline alloy and the amorphous alloy have the same chemical composition, they may differ from each other only with respect to the microstructure.

In some embodiments, crystalline precipitates in amorphous alloys may have an undesirable effect on the properties of amorphous alloys, especially on the toughness and strength of these alloys, and as such it is generally preferred to minimize the volume fraction of these precipitates. However, there may be cases in which ductile crystalline phases precipitate in-situ during the processing of amorphous alloys, which may be beneficial to the properties of amorphous alloys, especially to the toughness and ductility of the alloys. One exemplary case is disclosed in C. C. Hays et. al, Physical Review Letters, Vol. 84, p 2901, 2000. In at least one embodiment herein, the crystalline precipitates may comprise a metal or an alloy, wherein the alloy may have a composition that is the same as the composition of the amorphous alloy or a composition that is different from the composition of the amorphous alloy. Such amorphous alloys comprising these beneficial crystalline precipitates may be employed in at least one embodiment described herein.

A particular advantage of bulk solidifying amorphous alloys is their stability in the supercooled liquid region, defined as the viscous liquid regime above the glass transition temperature in one embodiment. The stability of this viscous liquid regime may be generally measured with $\Delta T$, which in one embodiment herein refers to the difference between the onset of crystallization temperature, Tx, and the onset of glass transition temperature, Tg, as determined from standard Differential Scanning calorimetry ("DSC") measurements at conventional heating rates (e.g. 20° C./min). In some embodiments, the bulk solidifying amorphous alloys may have $\Delta T$ of at least about 30° C.—e.g., at least about 50° C., about 60° C., about 70° C., about 80° C., about 90° C., or more.

Foldable Display Structure (FDS)

One aspect of the embodiments described herein provides a foldable display structure ("FDS") comprising amorphous alloys, and methods of making near-net shape foldable display structures from amorphous alloys. Due at least in part to the amorphous alloys, the FDS described herein may have characteristics that are both enabling and much improved over pre-existing display structures. The surprising advantages of foldable display structures comprising amorphous alloys, particularly bulk solidifying amorphous alloys, will be described in various embodiments below.

One embodiment provides FDS comprising amorphous alloys, the amorphous alloys providing form and shape durability combined with high flexibility, high resistance to chemical and environmental effects, and low-cost near-net shape fabrication for intricate design and shapes. Another embodiment provides a method of making foldable display structures from such amorphous alloys in near-net shape. The amorphous alloys may be bulk solidifying amorphous alloys.

Provided in one embodiment is a structure, the structure containing a display, and at least one structural component disposed over a portion of the display. The display may contain at least one organic material, including an OLED. In one embodiment, the display need not contain an organic material. In general, any flexible display material may be used. The display, or a portion thereof, may be foldable. In some embodiments, the entire structure is foldable. In one embodiment, the structure may be, or may comprise, a foldable display and, optionally, structural components. In one embodiment the structure comprises a display and at least one structural component.

The at least one structural component may contain at least one amorphous alloy. In one embodiment, the at least one structural component consists essentially of an amorphous alloy. In another embodiment, the at least one structural component consists of an amorphous alloy. The amorphous alloy may be any of the aforedescribed amorphous alloys, with any of the aforedescribed properties. In one embodiment, the amorphous alloy may be a bulk solidifying amorphous alloy.

The combination of high strength and high strength-to-weight ratio of the bulk solidifying amorphous alloys in one embodiment may significantly reduce the overall weight and bulkiness of foldable display structures, thereby allowing for the reduction of the thickness of these display structures while maintaining structural integrity and high flexibility. Furthermore, as described above, amorphous alloys, including bulk solidifying amorphous alloys, have high elastic strain limits. This property is important for the use and application for foldable display structures; specifically, a high elastic strain limit may allow the display structure to be thin and highly flexible. Additionally, a high elastic strain limit also may allow the foldable display structures described herein to sustain loading and/or flexing without permanent deformation or destruction and enable them to fold (and roll) into compact shapes for multiple use and opening and closure. The term "folding" herein may include "rolling" to refer to compacting a material. Due at least in part to the high elasticity, the foldable display described herein after multiple folding and unfolding of the structural component, may remain at least substantially flat, such as completely flat. In one embodiment, the foldable display may remain at least substantially at the same level of flatness after multiple folding and unfolding as before it was folded for the first time.

In addition, due at least in part to the amorphous alloy, the foldable display structures described herein may exhibit resistance to corrosion (e.g., chemical corrosion, stress corrosion, etc.) and high inertness. The high corrosion resistance and inertness of the amorphous alloy in the structural component may be useful for preventing foldable display structures from getting decayed due the environmental effects. Finally, the aforedescribed properties, in combination with the high strength, high hardness, high elasticity and corrosion resistance properties, may provide a foldable display structure that is durable and resistant to wear and scratch during normal use.

The foldable display structures, including the display and the structural component(s), described herein may have any geometry, including size or shape. The structure may have a symmetrical shape or an asymmetrical shape. In a plane view, the foldable display structures may be a square, rectangle, circle, elliptical, a polygon, or an irregular shape. In contrast to a frame or a housing, the structural component in many embodiments described herein does not cover an entire surface of the display. The structural component(s) may also have a variety of geometries, depending at least in part on the geometry of the foldable display. For example, the structural component may comprise wires, strips, fibers, ribbons, or combinations thereof. These wires, strips, fibers, ribbons, etc., may be disposed over (or directly on) the display in parallel to each other (or almost parallel to each other) or they may intersect one another to form a mesh. In one embodiment, the portion of the display that is foldable corresponds to the portion of the display over (or directly on) which the at least one structural component is disposed. The structural component may be joined to the display by any technique. In one embodiment, the structural component is joined to the display by a polymer, such as an epoxy glue or any other material that may bond the structural component to the display.

The display structure described herein may have multiple layers. In one embodiment, the structural component comprising an amorphous alloy may be disposed over a substrate layer, which in turn may be disposed over the display. The structural component may be sandwiched between the display and the substrate or may be over (or directly on) the substrate that is over (or directly on) the display.

The structural components may have any suitable dimensions, depending on the application. FIG. 1 shows a schematic of an exemplary foldable display structure comprising a display 101 and a structural component comprising a series of horizontally aligned strips 102 comprising an amorphous alloy (e.g., bulk solidifying amorphous alloy). The strips may have a thickness of between about 0.1 mm and 2.0 mm—e.g., between about 0.15 mm and about 1.5 mm, between about 0.2 mm and about 1.0 mm, between about 0.4 mm and about 0.8 mm, between about 0.5 mm and about 0.6 mm. Other ranges are also possible. The strips may have a width of between about 0.5 and about 20.0 mm—e.g. between about 1.0 mm and about 15 mm, between about 2.0 mm and about 10 mm, between about 4.0 mm and about 8.0 mm, between about 5.0 mm and about 6.0 mm. Other ranges are also possible. The length of the strips may vary, depending at least in part on the geometry of the display over (or directly on) which the structural component is disposed. The strips may be extended to the edge of the display or extended further outward of the edge of the display. In this embodiment, the display may be folded (including being rolled) in a segmented manner, with the strips providing certain rigidity along the display. In a preferred embodiment the strips are bonded to OLED display with various joining methods such as using epoxy glue.

Figure 2:
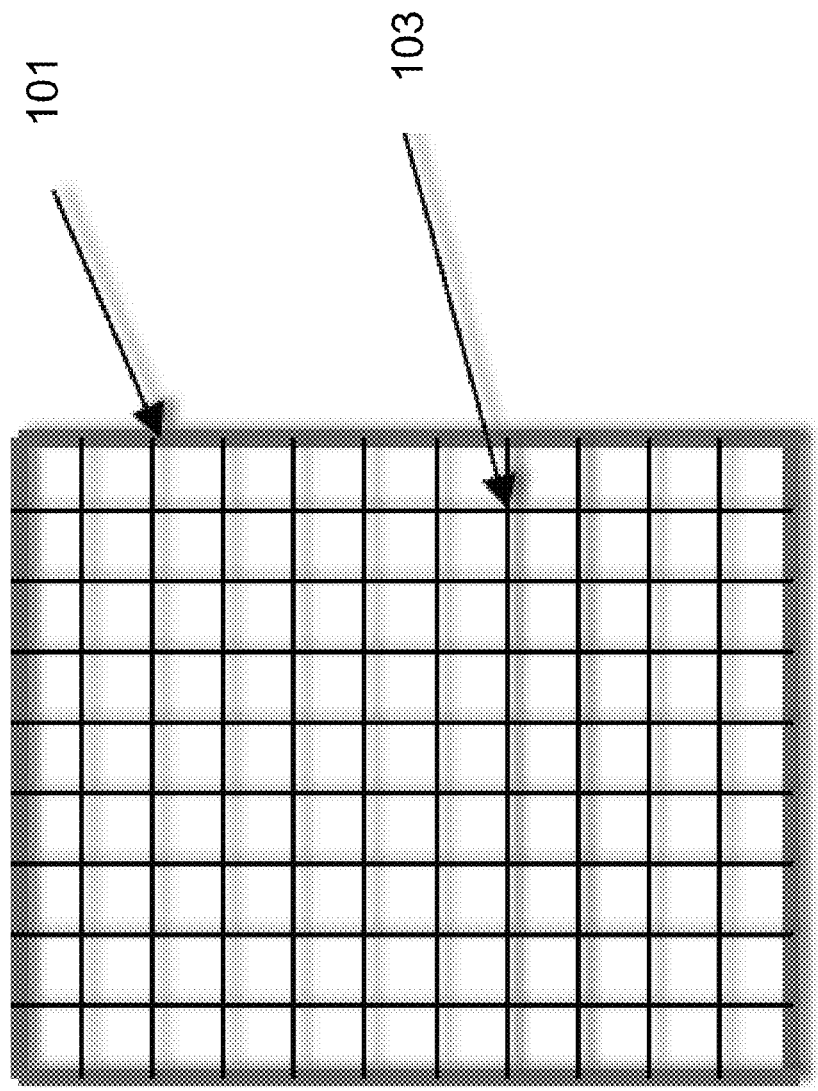
FIG. 2 provides a schematic of a foldable display structure according to one exemplary embodiment.

FIG. 2 shows a schematic of an exemplary foldable display structure comprising a display 101 and a structural component comprising a mesh of horizontally and longitudinally aligned fibers 103 comprising an amorphous alloy (e.g., bulk solidifying amorphous alloy). The fibers may have a diameter of between about 0.01 mm and 2.0 mm—e.g., between about 0.02 mm and about 1.5 mm, between about 0.03 mm and about 1.0 mm, between about 0.05 mm and about 0.5 mm, between about 0.1 mm and about 0.4 mm, between about 0.2 mm and about 0.3 mm. Other ranges are also possible. The mesh network may be extended to the edge of the display or may be extended further outward of the edge of the display. In this embodiment, the display can be folded in a continuous manner, wherein the fiber mesh provides flexibility for rolling and rigidity and flatness upon opening of the display. In one embodiment the fiber mesh is bonded to the display with various joining methods such as using epoxy glue.

Figure 3:
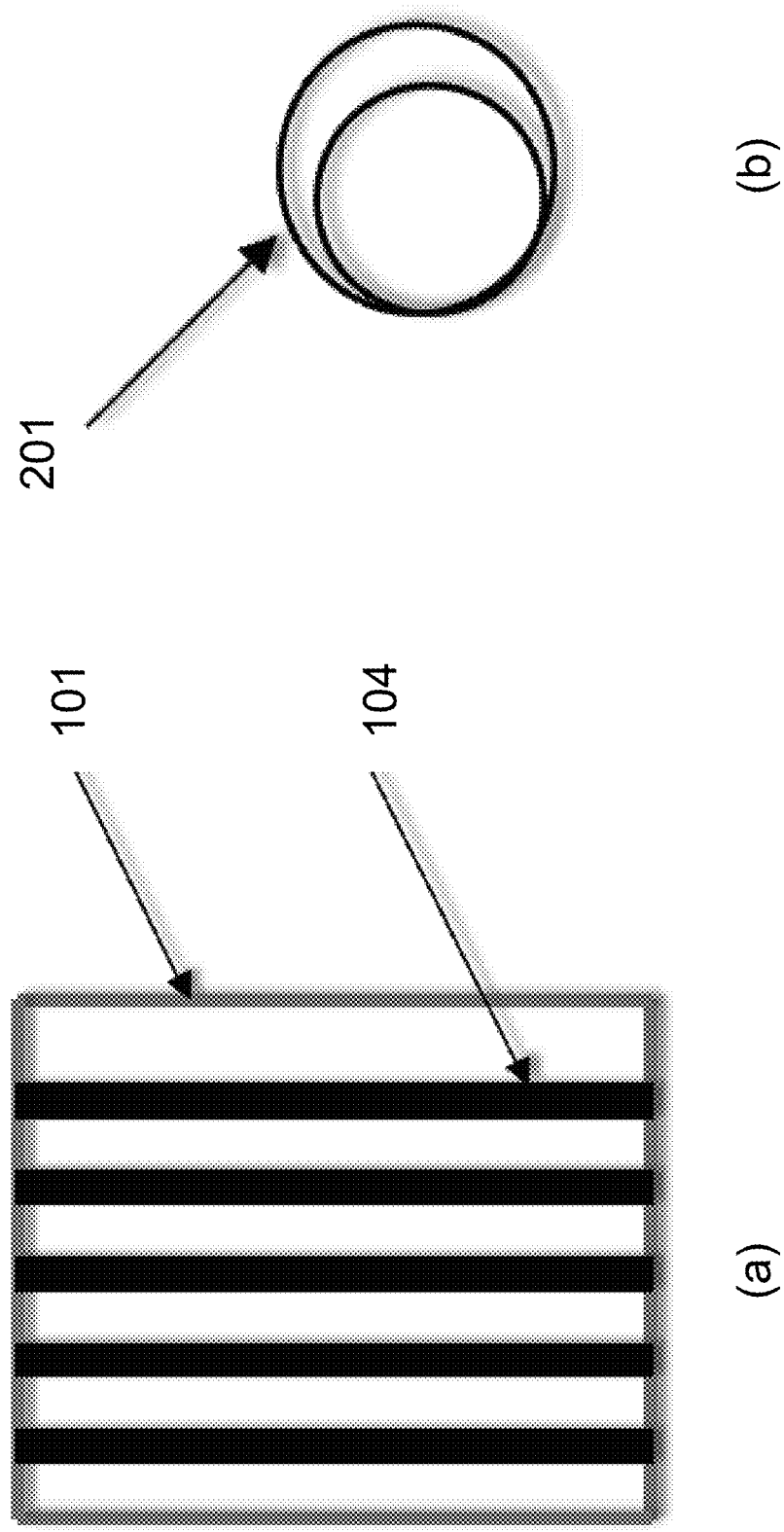
FIGS. 3(a)-3(b) provide a schematic of a foldable display structure and the display in folded and rolled configurations, respectively, according to one exemplary embodiment.

FIG. 3(*a*) shows a schematic of an exemplary foldable display structure comprising a display 101 and a structural component comprising a set of longitudinally aligned ribbons 104 comprising an amorphous alloy (e.g., bulk solidifying amorphous alloy). The ribbons may have a thickness of between about 0.01 mm and 2.0 mm—e.g., between about 0.02 mm and about 1.5 mm, between about 0.03 mm and about 1.0 mm, between about 0.05 mm and about 0.5 mm, between about 0.1 mm and about 0.4 mm, between about 0.2 mm and about 0.3 mm. The ribbons may have a width of between about 0.5 and about 20.0 mm—e.g. between about 1.0 mm and about 15 mm, between about 2.0 mm and about 10 mm, between about 4.0 mm and about 8.0 mm, between about 5.0 mm and about 6.0 mm. The ribbons may be extended to the edge of the display or may be extended further outward of the edge of the display. In this embodiment, the display may be folded in a continuous manner, wherein the ribbons may provide flexibility for rolling and rigidity and flatness upon opening of the display. In one embodiment the ribbon mesh is bonded to the display with various joining methods such as using epoxy glue.

In some embodiments described herein, the terms "ribbons" and "fibers" refer to highly flexible components, each of which may be folded (as shown in 201 in FIG. 3(*b*)) into a diameter in the range of about 10 mm to about 100 mm (e.g., about 20 mm to about 80 mm, about 40 mm to about 60 mm), whereas the terms "strips" and "wires" refer to relatively rigid components, each of which can be folded into a diameter larger than 30 mm (e.g., larger than 40 mm, 50 mm, 60 mm, or larger).

Due at least in part to the desired properties as described above, the FDS described herein may be employed as a component of a variety of devices, including an electronic device. An electronic device herein may refer to a mobile phone, smart phone, PDA, computer (e.g., laptop, desktop, tablet computer, etc.), television, and various wall-mountable displays. A device may contain a plurality of the FDSs described herein. In one embodiment, multiple FDSs may be joined together to form one large display. For example, FDS of a small size (e.g., smaller than a pre-existing personal reader or tablet computer) may function as secondary displays off one device (e.g., smart phone). In one embodiment wherein the FDSs are a part of a smart phone, one FDS may be used to perform navigation function while another to read email, and at the same time the smart phone may be used for talking—this may be done with one data plan as well. In another embodiment, at home or in office, one "connected" device may be used to drive multiple FDSs, some as TVs, some as computers, and some as communication devices simultaneously, sequentially, or both. In at least one embodiment, the display structures described herein are more desirable due to their extreme light weight, flexibility and being less prone to breakage, in comparison to the pre-existing glass-based displays such as LCD (Liquid Crystal Displays).

Method of Making

Another aspect of the embodiments described herein provides a method of making a foldable display structure, such as one in near-net shape form, which display structure comprises a display comprising an organic material and at least one structural component comprising at least one amorphous alloy. The display and the structural component may be any of those described above.

One embodiment provides a method of making a foldable display structure, the method comprising: providing a feedstock of amorphous alloy being substantially amorphous and having an elastic strain limit of about 1.5% or greater and a $\Delta T$ of 30° C. or greater; heating the feedstock to around the glass transition temperature; shaping the heated feedstock into the desired near-net shape of foldable display structure; and cooling the formed part to temperatures far below the glass transition temperature. As described above, $\Delta T$ refers to the difference between the onset of crystallization temperature, Tx, and the onset of glass transition temperature, Tg, In one embodiment, a temperature around glass transition refers to a temperature that can be below glass transition, at or around glass transition, and above glass transition temperature, but always at a temperature below the crystallization temperature Tx. The cooling step may be carried out at rates similar to the heating rates at the heating step. Alternatively, it may be carried out at rates greater than the heating rates at the heating step. The cooling step may be also achieved while the forming and shaping are maintained.

One embodiment provides a method of making a foldable display structure, the method comprising: providing a homogeneous alloy ingot (not necessarily fully or partially amorphous); heating the feedstock to a casting temperature above the melting temperatures; introducing the molten alloy into the die cavity having the near-net shape of foldable display structures and quenching the molten alloy to temperatures below glass transition.

One embodiment provides a method of making a foldable display structure, the method comprising: assembling a display with at least one structural component. The assembling may involve disposing and/or joining the at least one structural component over a portion of the display. As described above, the joining may involve gluing together (e.g. with epoxy glue) the display and the at least one structural component. One advantage of the methods described herein is that the assembling of the components of the foldable display structure may involve no (or minimal) use of fasteners.

In one embodiment wherein the display structures provided herein have a substrate and a display, the structural component may be disposed over (or directly on) the substrate during production of the substrate. The substrate may be contain any material, including those used in pre-existing displays, such as plastics, glass, etc. Because an amorphous alloy (of the structural component) may withstand higher temperatures than most plastics and synthetic substrate material, synthetic material may be poured over the structural component to form an intimate bond. The bond may be chemical, physical, or both. An intimate bond may refer to a bond that has very little observable gap between the bonded components, and in some instances, as a result, that the components may not separate easily. Alternatively, structural component(s) may be provided between two sticky substrate materials so that all of these may be bonded.

The at least one structural component may be made by a method comprising: heating a feedstock comprising an alloy that is at least substantially amorphous to a first temperature that is greater than or equal to a glass transition temperature (Tg) of the alloy; forming the heated feedstock into a preform; and cooling the preform to a second temperature lower than the Tg to form the at least one structural component.

The feedstock may comprise an alloy that is at least partially, such as at least substantially, such as completely, amorphous. The method may further include a method of making an alloy feedstock. The method of making an alloy feedstock may include: heating at least one ingot comprising an alloy that is at least partially not amorphous to a third temperature that is higher than or equal to a melting temperature (Tm) of the alloy; and cooling the heated ingot at a rate that is sufficient to form the feedstock comprising an alloy that is at least substantially amorphous. The ingot may comprise a mixture of elements to be alloyed to form the feedstock. The ingot may be homogeneous (although it need not be) with respect to the chemical composition of the elements of the alloy mixture, but may not be of an amorphous phase. The cooling rate during the making of the feedstock may be fast enough to bypass the crystallization formation region in the Time-Temperature-Transformation (TTT) diagram to avoid formation of a crystalline phase, thereby to form a feedstock that is at least partially amorphous.

In one embodiment, during the process of making a foldable display structure, the heated feedstock is formed into a preform before the preform is cooled to form the final structural component of the display structure. The forming may include, for example, shaping the preform into a desired shape. This process may involve any techniques known in the art. For example, this may involve die casting, involving introducing the feedstock into a cavity of a die to form a preform. In some embodiments, the forming may involve shaping the feedstock into the preform with pressure. The pressure may be mechanical pressure, for example by hand, tool, or air pressure. The preform may be near-net shape of the structural component. In other words, no (or minimal) additional processing would be needed to shape the preform into the desired shape of the structural component. In some embodiments, certain post-processing, such as certain surface treatments, may be employed. For example, surface treatment may be employed to remove oxides on the surface. Chemical etching (with or without masks), as well as light buffing and polishing operations, may also be employed to improve the surface finish.

The near-net shape of the structural component of the display structures during the processes described herein is one distinguishing feature compared to the pre-existing process. Specifically, the preferred material of the pre-existing process, which employs shape-memory Ti—Ni alloys and/or spring steels, may only be produced in very limited shapes and forms, such as wires and flat strips because of the difficulty thereof to produce near-net shaped products. By contrast, the near-net shape forming ability of amorphous alloys, particularly bulk solidifying amorphous alloy, of the processes described herein allow fabrication of intricate foldable display structures with high precision and reduced processing steps. Additionally, this may also allow minimal use of bending and welding, which can reduce the structural performance and increase manufacturing costs and aesthetic defects. In one embodiment, producing foldable display structures in near-net shape form may reduce significantly the manufacturing costs while still forming foldable display structures with intricate features, such as precision curves, and a high surface finish on aesthetically sensitive areas. Also, not to be bound by any particular theory, but (bulk solidifying) amorphous alloys retain their fluidity from above the melting temperature down to the glass transition temperature due to the lack of a first order phase transition. This is distinguishable from conventional crystalline metals and alloys, or even certain amorphous alloys in some instances. Because amorphous alloys retain their fluidity, they do not accumulate significant stress from their casting temperatures down to below the glass transition temperature. Thus, dimensional distortions from thermal stress gradients can be minimized.

Exemplary Embodiments

The following exemplary embodiments are provided in the Summary and Claims of the parent provisional application U.S. Ser. No. 61/522,949, filed Aug. 12, 2012.

In one embodiment, the foldable display structure comprises at least one part made of bulk solidifying amorphous alloy.

In another embodiment, the foldable display structure comprises longitudinally aligned ribbons or fibers substantially made of bulk solidifying amorphous alloy and attached to the back (substrate side) of OLED display.

In another embodiment, the foldable display structure comprises horizontally aligned ribbons or fibers substantially made of bulk solidifying amorphous alloy and attached to the back of OLED display.

In still another embodiment, the foldable display structure comprises a mesh of ribbons or fibers substantially made of bulk solidifying amorphous alloy and attached to the back of OLED display.

In still another embodiment, the foldable display structure comprises a set of ribbons or fibers substantially made of bulk solidifying amorphous alloy and joined to the back of OLED display.

In still another embodiment, the foldable display structure comprises diagonally crossing and rigid strips or wires substantially made of bulk solidifying amorphous alloy and attached to the back of OLED display.

In one embodiment, the foldable display structure is at least partially made of a Zr—Ti base bulk solidifying amorphous alloy.

In another embodiment, the bulk solidifying amorphous alloy in the foldable display structure is Be free.

In another embodiment, the foldable display structure is at least partially made of a Zr/Ti base bulk solidifying amorphous alloy with in-situ ductile crystalline precipitates.

In another embodiment, a molten piece of bulk solidifying amorphous alloy is cast into a near-net shape manufactured foldable display Structure.

In another embodiment, a stock feed of bulk solidifying amorphous alloy is molded into a near-net shape manufactured foldable display Structure.

In another embodiment, at least part of a near-net shape manufactured foldable display structure is formed by casting or molding the bulk solidifying amorphous alloy.

In another embodiment, the near-net shape manufactured foldable display structure is a near-net shape molding component.

In another embodiment, the near-net shape manufactured Foldable display structure is a near-net shape cast component.

One embodiment provides a method of fabricating a near-net shape manufactured foldable display structure comprising the following steps: providing a feedstock of molten alloy at above Tm; introducing the molten alloy to a die cavity having the near-net shape of foldable display Structure; quenching and taking the part out of the die cavity; and final finishing.

Another embodiment provides a method of fabricating a near-net shape manufactured foldable display structure comprising the following steps: providing a feedstock of alloy that is at least partially amorphous; heating the feedstock to above Tg but below Tx, shaping the heated feedstock into desired near-net shape foldable display structure; cooling; and final finishing.

Another embodiment provides a foldable display structure comprising bulk solidifying amorphous alloys.

Another embodiment provides a method of making foldable display structure in a near-net shape form comprising bulk solidifying amorphous alloys.

Another embodiment provides a foldable display structure having a structure substantially made of bulk solidifying amorphous alloys, wherein the structural components are secured without the use of fasteners.

CONCLUSION

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more"

of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed:

1. A structure, comprising:
   a display comprising semiconductor devices, wherein a portion of the display is foldable; and
   a plurality of structural components disposed over substantially throughout the display within the interior of the display, wherein the plurality of structural components is configured to provide structural stability and rigidity to maintain a flat shape of the display after multiple folding and unfolding or rolling and unrolling of the display,
   wherein each of the plurality of structural components comprises at least one amorphous alloy that has a $\Delta T$ of at least 30° C.,
   wherein $\Delta T$ represents the difference between the onset of crystallization temperature (Tx) for the plurality of structural components, and the onset of glass transition temperature (Tg) of the at least one amorphous alloy, as determined from standard differential scanning calorimetry (DSC) measurements.

2. The structure of claim 1, wherein the amorphous alloy is a bulk solidifying amorphous alloy.

3. The structure of claim 1, wherein the display comprises an organic material.

4. The structure of claim 1, wherein at least one of the plurality of the structural components comprises wires, strips, fibers, ribbons, or combinations thereof.

5. The structure of claim 1, wherein at least one of the plurality of the structural components comprises a mesh of wires, strips, fibers, ribbons, or combinations thereof.

6. The structure of claim 1, wherein at least one of the plurality of the structural components comprises (i) fibers having a diameter of between about 0.05 mm and about 0.5 mm, or (ii) ribbons having a thickness of between about 0.05 mm and about 0.5 mm and a width of about 2 mm and about 10 mm.

7. The structure of claim 1, wherein at least one of the plurality of the structural components is not disposed over an entirety of the display.

8. The structure of claim 1, wherein at least one amorphous alloy comprises a Zr-based, a Ti-based, a Zr—Ti-based, an Fe-based, or combinations thereof, amorphous alloy.

9. The structure of claim 1, wherein the portion of the display that is foldable corresponds to the portion of the display over which at least one of the plurality of the structural components is disposed and remains at least substantially flat after multiple folding.

10. The structure of claim 1, wherein the structure is a part of an electronic device.

11. The structure of claim 1,
    wherein the display comprises at least one organic light emitting diode;
    wherein at least one of the plurality of the structural components comprises at least one bulk solidifying amorphous alloy; and
    wherein the display remains at least substantially flat after multiple folding.

12. The structure of claim 11, wherein the plurality of the structural components has an elastic strain limit of at least 1.5%.

13. The structure of claim 11, wherein the plurality of the structural components has a $\sim\Delta T$ of at least about 30° C. to about 90° C.

14. The structure of claim 11, wherein the bulk solidifying amorphous alloy is at least substantially free of Be.

15. The structure of claim 11, wherein the bulk solidifying amorphous alloy further comprises a plurality of crystalline precipitates.

16. The structure of claim 1, wherein the plurality of the structural components comprises a series of horizontally aligned strips.

17. The structure of claim 1, wherein the plurality of the structural components comprises a mesh of horizontally and longitudinally aligned fibers.

18. The structure of claim 1, wherein the plurality of the structural components comprises a series of longitudinally aligned ribbons.

* * * * *